May 31, 1960

B. H. GRIFFITH, JR

PRINTED CIRCUIT ASSEMBLY 2,939,051

Filed Sept. 3, 1958

2 Sheets-Sheet 1

INVENTOR.
B. H. GRIFFITH, JR.
BY Wade Koontz
ATTORNEY
Richard J. Killoren
AGENT

May 31, 1960

B. H. GRIFFITH, JR 2,939,051

PRINTED CIRCUIT ASSEMBLY

Filed Sept. 3, 1958

2 Sheets-Sheet 2

INVENTOR.
B. H. GRIFFITH, JR

BY Wade Koontz
ATTORNEY
Richard J Killoran and
AGENT 2,939,051

PRINTED CIRCUIT ASSEMBLY

Ben H. Griffith, Jr., Baltimore, Md., assignor, by mesne assignments, to the United States of America as represented by the Secretary of the Air Force Filed Sept. 3, 1958, Ser. No. 758,872

3 Claims. (Cl. 317—101)

This invention relates to a printed circuit assembly having separate shielding means for the printed circuit, tubes and other circuit components.

One object of the invention is to provide a printed circuit assembly wherein a circuit shielding element is mounted in close proximity to the printed circuit.

Another object is to provide a printed circuit assembly wherein the tubes are mounted on the same side of the board as the printed circuit to provide good ventilation and cooling for the tubes.

A further object of the invention is to provide a printed circuit assembly wherein the shields are easily removed to make the parts more accessible.

These and other objects will be more fully understood from the following detailed description taken with the drawing wherein.

Figure 1:
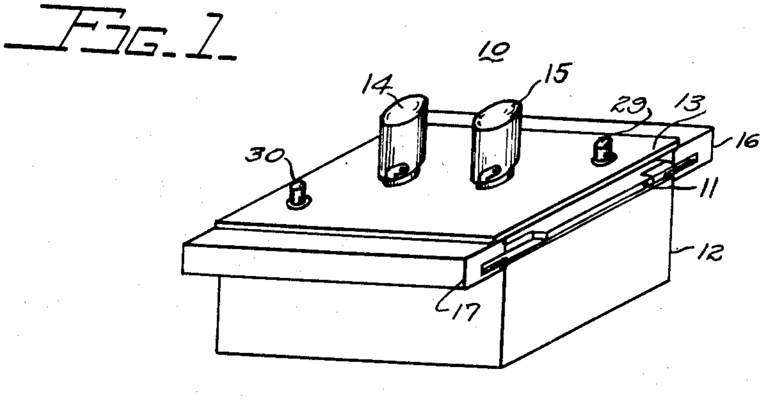
Fig. 1 is an isometric view of a printed circuit assembly according to the invention.
Figure 2:
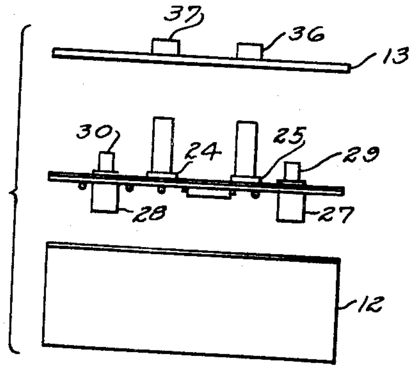
Fig. 2 is an exploded view of the printed circuit assembly of Fig. 1.
Figure 3:
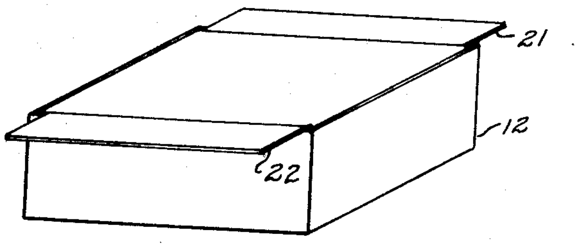
Fig. 3 is an isometric view of the bottom shield for the device of Fig. 1.

Referring more particularly to Fig. 1 of the drawing, the circuit assembly 10 has; a panel 11 on which the printed circuit, tubes and other circuit components are mounted, as will be explained in more detail with reference to Fig. 4, a bottom shield 12, a top shield 13, tube shields 14 and 15 and a pair of members 16 and 17 for securing the bottom shield 12 to the panel 11. The bottom shield 12, as shown in Fig. 3, has two members 21 and 22 for securing the shield to the panel member 11 and for making electrical contact therewith. The shield 12 may have partitions therein to isolate any particular sections of the circuit from the other sections of the circuit, as may be desired.

Figure 4:
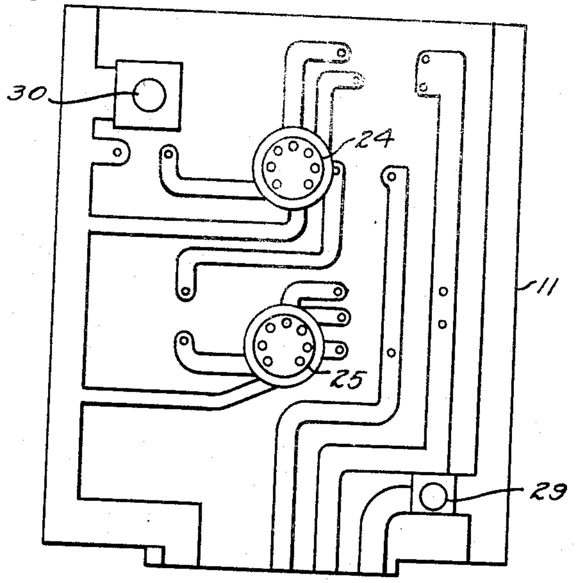
Fig. 4 is a top view of the printed circuit panel for the device of Fig. 1.
Figure 5:
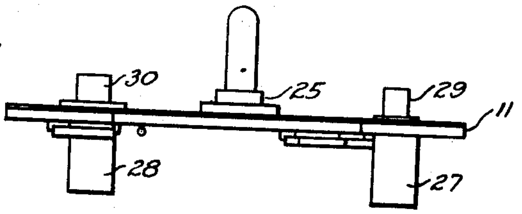
Fig. 5 is a side view of the panel of Fig. 4.
Figure 6:
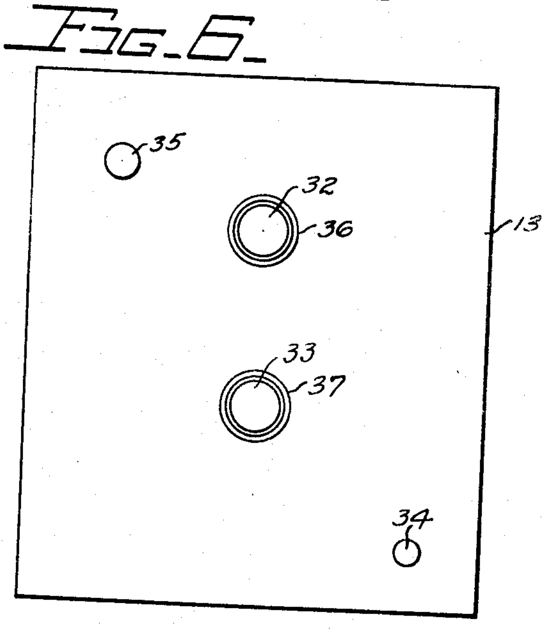
Fig. 6 is a top view of the upper shield used in the device of Fig. 1.

Figs. 4 and 5 of the drawing show the panel member 11 having a printed circuit on the upper surface thereof. The circuit shown is merely illustrative and is not directed to any particular type of device. Tube mounts 24 and 25 are also mounted on the upper surface of the panel 11. All of the other circuit components are mounted on the other surface of panel 11, have their terminals extending through the panel and are connected to the printed circuit on the upper surface of the panel. The tunable elements of the circuit 27 and 28 which are elements such as potentiometers, variable coils, variable and trimmer capacitors, etc. are mounted on the lower surface of the panel and have their control shafts 29 and 30 projecting through the board to the same side as the printed circuit. The upper shield 13 has openings 32 and 33 therein for the tubes and openings 34 and 35 for the control shafts. Base members 36 and 37 for the tube shields 14 and 15 are mounted on the upper surface of shield 13. The upper shield is mounted in close proximity to the printed circuit and thereby checks cross coupling due to the length of the leads and coupling due to the electrical and magnetic fields of the circuit. The tube shields 14 and 15 contact the glass envelope of the tubes and thereby tend to cool the tubes. By mounting the tubes on the upper surface of the shield they are exposed to better ventilation.

There is thus provided a printed circuit assembly in which the printed circuit shielding element is mounted in close proximity to the printed circuit, which provides good ventilation and cooling for the tubes and in which the shielding members are easily removed to make the parts readily accessible.

Though one specific embodiment has been described in some detail, it is to be understood that numerous changes may be made without departing from the general principles and scope of the invention.

What is claimed is:

1. A printed circuit assembly, comprising; a circuit support panel, a printed circuit on one surface of said panel, means for mounting the tubes for said circuit on the same side of said support panel as the printed circuit, means for mounting the other circuit components on the opposite side of said support panel, said support panel having openings therethrough for the control shafts for the control elements of said circuit, a first shield member inclosing components on said other side of said support panel, means for securing said first shield to said support panel, a second shield located in close proximity to said printed circuit and having therein openings for said tubes and said control shafts.

2. A printed circuit assembly, comprising; a circuit support panel, a printed circuit on one surface of said support panel, means for mounting the electron tubes for said circuit on the same side of said support panel as the printed circuit, means for mounting the other circuit components on the opposite side of said support panel, said support panel having openings therethrough for the control shafts for the variable control elements of said circuit, a first shield for inclosing said other circuit components on said other side of said support panel, means for securing said shield to said support panel, a second shield located in close proximity to said printed circuit, said second shield having openings therein for said control shafts and said tubes, said second shield having means thereon for securing tube shields thereto.

3. A printed circuit assembly, comprising: an electron tube circuit having tubes and other circuit elements such as resistors, condensers, fixed coils, variable coils and potentiometers, a printed circuit connecting the various circuit elements together, a circuit support panel, said printed circuit being located upon one surface of said support panel, means for mounting said tubes upon the same surface of said support panel, means for mounting the other circuit components on the opposite side of said support panel, said support panel having openings therethrough for the control shafts for the variable elements within said circuit, a first shield member for inclosing said other circuit components, said shield having partitions therein for shielding certain components from other components, means for securing said shield to said support panel, a second shield located in close proximity to said printed circuit, said second shield having openings therein for said tubes and said control shafts, a tube shield for each tube within said circuit, said second shield having means thereon for securing said tube shields thereto.

References Cited in the file of this patent

UNITED STATES PATENTS

| | | |
|---|---|---|
| 2,066,876 | Carpenter | Jan. 5, 1937 |
| 2,468,727 | Bauman | May 3, 1949 |
| 2,586,854 | Myers | Feb. 26, 1952 |